United States Patent [19]

Ueno

[11] 4,109,198
[45] Aug. 22, 1978

[54] PEAK LEVEL INDICATING ELECTRONIC CIRCUIT

[75] Inventor: Shoji Ueno, Yokohama, Japan

[73] Assignee: Victor Company of Japan, Limited, Yokohama, Japan

[21] Appl. No.: 721,046

[22] Filed: Sep. 7, 1976

[30] Foreign Application Priority Data

Sep. 8, 1975 [JP] Japan ............... 50/122791

[51] Int. Cl.² .............. G01R 19/16; H03K 5/20
[52] U.S. Cl. ................... 324/103 P; 307/351
[58] Field of Search ........... 324/103 P, 103 R, 96, 324/122; 356/226, 227; 307/351

[56] References Cited
U.S. PATENT DOCUMENTS

| | | | |
|---|---|---|---|
| 2,486,890 | 11/1949 | Stanmyre | 324/103 R |
| 2,924,769 | 2/1960 | Harriman et al. | 324/103 P |
| 3,794,430 | 2/1974 | Maida | 356/226 |
| 3,825,827 | 7/1974 | Tumbush | 324/96 |
| 3,961,256 | 6/1976 | Gaskell et al. | 324/122 |
| 4,004,220 | 1/1977 | Kerber et al. | 324/103 P |

*Primary Examiner*—Rudolph V. Rolinec
*Assistant Examiner*—Ernest F. Karlsen
*Attorney, Agent, or Firm*—Lowe, King, Price & Markva

[57] ABSTRACT

An a.c. input signal is supplied to at least one input terminal to which at least one rectifier is connected for converting the a.c. input signal to a d.c. signal corresponding thereto. A plurality of transistors are connected between the at least one rectifier and a general purpose integrated circuit with a threshold value. Each of plural transistors is controlled in its on/off operation by the d.c. signal from the rectifier in order to control the output potential of the integrated circuit. A plurality of indicators are connected between a d.c. power source and outputs of the integrated circuit to be discretely and sequentially energized to indicate a peak level of the a.c. input signal.

13 Claims, 8 Drawing Figures

PEAK LEVEL INDICATING ELECTRONIC CIRCUIT

The present invention relates in general to a peak level indicating electronic circuit for use with a general purpose integrated circuit having a threshold value, more particularly to such a circuit for discretely and sequentially providing an indication of an exact peak level of, for example, an audio signal to be recorded or reproduced by a general audio equipment.

Before describing the present invention, reference is now made to FIG. 1 which illustrates details of a conventional peak level indicating electronic circuit.

The cathode of diode 32 is connected to an input terminal 30, to which an audio signal is supplied; the anode of diode 32 is connected to one end of a variable resistor 34, having another end connected to the ground. A capacitor 36 is connected between the ground and the resistor 34 through slider 35. The resistor 34 and the capacitor 36 form a smoothing circuit for removing ripple components of a d.c. signal from the rectifier diode 32. Series connected resistors 38 and 42 are interposed between slider 35 and the base of transistor 48. The collector and base of NPN transistor 48 are respectively directly connected to the base and emitter of another NPN transistor 54. The collector of the transistor 48 is connected through resistor 46 to a positive DC power supply voltage at terminal 44. On the other hand, the collector of the transistor 54 is connected to the terminal 44 through a suitable indicating lamp 52 and a resistor 50. The emitters of the transistors 48 and 54 are connected to the ground through a resistor 56. In the above, the transistors 48 and 54 form a so-called Schmitt circuit.

With this arrangement, when an input a.c. signal is fed to the terminal 30, the signal is rectified by the half-wave rectifier, viz., the diode 32. The rectified signal is then fed to the smoothing circuit including of the variable resistor 34 and the capacitor 36, so the smoothing circuit smooths the rectified signal to generate a smoothed negative d.c. signal. This d.c. signal is then fed to the base of the transistor 48 through the resistors 38 and 42 to lower the potential at the base of the transistor 48. In response to the a.c. signal applied to the terminal 30 being above a predetermined value, the magnitude of the negative d.c. signal derived from the smoothing circuit increases to render the transistor 48 nonconductive. Consequently, the potential at the base of the transistor 54 becomes approximately that of the d.c. power source connected to the terminal 44, so that the transistor 54 is rendered conductive. Thus, a current flows through the resistor 50, a lamp 52, the transistor 54 and the resistor 56. Therefore, the lamp 52 is energized to indicate that the a.c. signal fed to the terminal 30 is above the predetermined level.

On the contrary, when the a.c. signal fed to the terminal 30 is below the predetermined level or no a.c. signal is fed to the terminal 30, the transistor 48 is in turn rendered conductive, due to the values of the resistors 38, 40 and 42 which are selected to forward bias the base of transistor 48 to obtain such a condition. The conductive state of the transistor 48 biases transistor 54 to be nonconductive so lamp 52 is not energized. In the above, the energization level of the lamp 52 can be adjusted by changing the voltage division factor of variable resistor 34 by adjusting slider 35.

In the above described conventional peak level indicating circuit, however, some drawbacks occur, as follows. That is, usually, in audio equipments, such as a preamplifier, a power amplifier, a tape deck, or a public-address amplifier, it is necessary to discretely and sequentially indicate a peak level of an incoming a.c. signal. In such a case, the number of circuits as illustrated in FIG. 1, should equal the number of the indicating lamps, thereby making the circuit configuration complicated and very expensive. Additionally, the peak level of the circuit of FIG. 1 is adversely affected by ambient temperature. More specifically, the rectified current from the diode 32 changes depending upon the ambient temperature thereby to change the energization level of lamp 52 undesirably.

An object of the present invention is therefore to provide an improved peak level indicating electronic circuit which removes the above described defects inherent in the prior art.

Additional objects as well as features and advantages of the invention will become evident from the detailed description set forth hereinafter when considered in conjunction with the accompanying drawings, wherein like parts in each of the several figures are identified by the same reference numerals and characters, and wherein.

Figure 2:
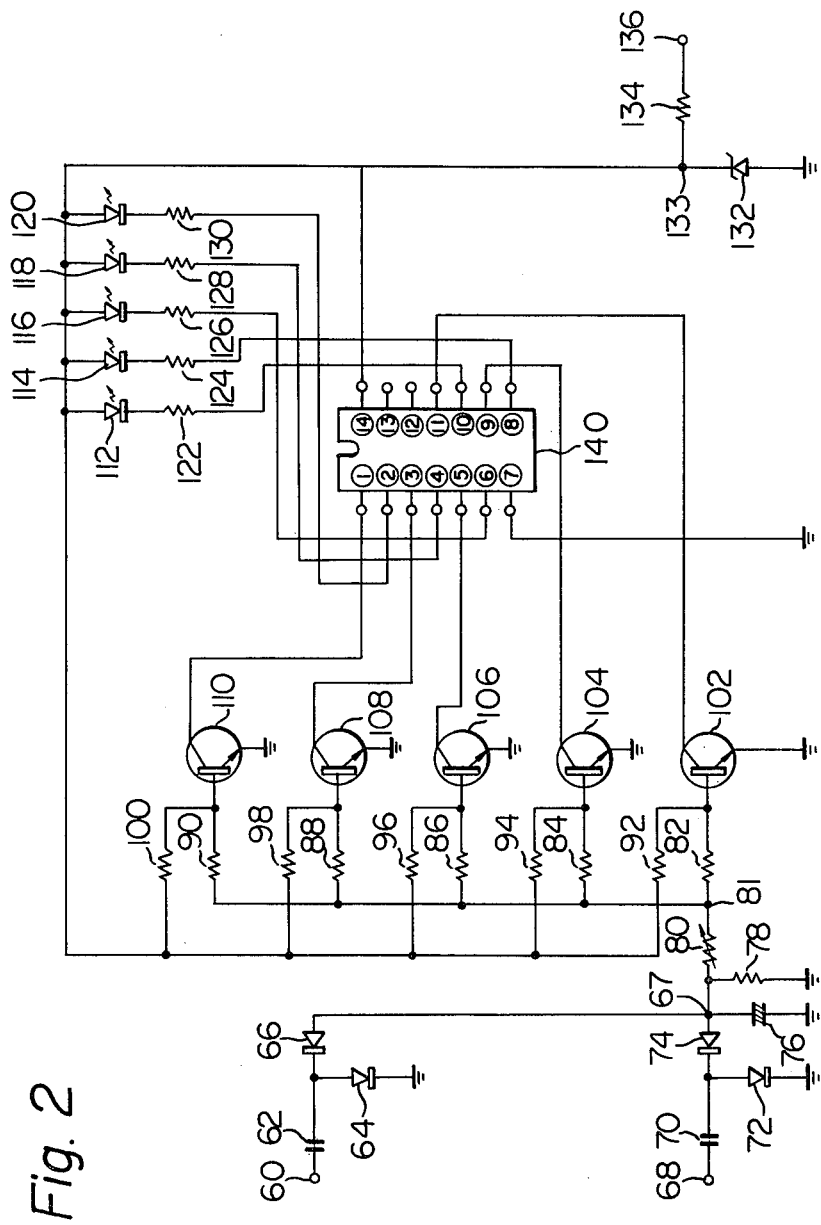
FIG. 2 is a circuit diagram of a peak level indicating circuit embodying the present invention.

Reference is now made to FIG. 2, which illustrates a peak level indicating circuit embodying the present invention. As shown, two input terminals 60 and 68 respectively respond to first and second AC signals. In the following, it is assumed that the two input terminals 60 and 68 receive stereophonic audio signals of the left and the right channel, respectively. The input terminal 60 is connected to a voltage doubler type rectifier including capacitor 62 and two diodes 64 and 66. The terminal 60 is connected through the capacitor 62 to a junction between the diodes 64 and 66. The cathode and anode of diode 64 are respectively connected to ground and to one end of the capacitor 62. On the other hand, the cathode and anode of diode 66 are respectively connected to of the diode 64 and the anode to junction 67, between an anode of a diode 74 and one end of a capacitor 76, having another end connected to the ground. Terminal 68, responsive to the right channel audio signal is connected to another rectifier of voltage doubler type comprising capacitor 70 and two diodes 72 and 74. The terminal 68 is connected through the capacitor 70 to a junction between the diodes 72 and 74. The cathode and anode of diode 72 are respectively connected to the ground and cathode of the diode 74. Shunt capacitor 76, together with shunt resistor 78, a smoothing circuit for the DC voltage at terminal 67.

The audio signal from the input terminal 60 is rectified by the rectifier, comprising capacitor 62 and the diodes 64 and 66, into a first negative d.c. signal that lowers the DC voltage at terminal 67. The first DC signal is smoothed by the smoothing circuit including capacitor 76 and the resistor 78. In the same manner as the above, the audio signal from the input terminal 68 is rectified by the rectifier, which consists of the capacitor 70 and the diodes 72 and 74, to a second negative DC signal that also lowers the DC voltage at terminal 67. The second DC voltage at terminal 67 is also smoothed by the smoothing circuit comprising the capacitor 76 and shunt resistor 78. The first and second smoothed DC signals are added and fed to variable resistor 80 that is connected between terminals 67 and 81; varying resistor 80 adjusts on/off voltage levels of transistors 102, 104, 106, 108, and 110. Because of the nature of the rectifying voltage doubler circuit and the isolation provided by resistor 80, as well as resistors 82, 84, 86, 88, 90, 92, 94, 96, 98 and 100, to a positive, regulted DC bias voltage at terminal 133, the voltage at terminal 81 varies from zero to a negative value. Because of this factor there is considerable sensitively for control of transistors 102, 104, 106, 108 and 110 in response to the amplitude of the sources at terminals 60 and 68.

The combined, negative going smoothed first and second DC signals at terminal 67 are fed through variable resistor 80 and resistors 82, 84, 86, 88 and 90, in parallel, to the bases of the transistors 102, 104, 106, 108, and 110, respectively. The values of the resistors 82, 84, 86, 88 and 90 differ one from another in such a manner that the value of the resistor with a lower reference numeral is smaller than that of the resistor with a higher reference numeral. In other words, the values of resistors 82, 84, 86, 88 and 90 are progressively larger with ascending reference numerals.

The bases of transistors 102, 104, 106, 108 and 110 are respectively connected through equal valued resistors 92, 94, 96, 98 and 100 to a regulated DC power supply voltage at terminal 133 that normally forward biases each of the transistors into a conducting state; i.e., in response to no signal at terminals 60 or 68 all of transistors 102, 104, 106, 108 and 110 have low impedance emitter collector paths. To derive the regulated voltage at terminal 133, Zener diode 132 and resistor 134, which is biased by a positive DC power source at terminal 136, are connected to terminal 133.

The relative attenuations of the DC signals fed to the bases of the transistors 102, 104, 106, 108 and 110 from the smoothing circuit including capacitor 76 and the resistor 78, are such that the attenuation of the signal at the base of the transistor 102 is the smallest and that of the transistor 110 is the largest. This results from the progressively increasing values of resistors 82, 84, 86, 88 and 90, and the equal values of the resistors 92, 94, 96, 98 and 100.

Therefore, it is understood from the above that transistors 102, 104, 106, 108 and 110 are discretely and sequentially energized, depending upon the magnitude of the composite negative going DC signal at terminal 67, that lowers the voltage at terminal 81 by an amount proportional to the sum of the magnitudes of the audio signals fed to the input terminals 60 and 68.

Figure 4:
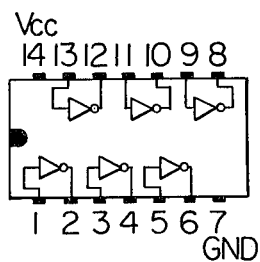
FIGS. 4 and 5 are detail circuits of a conventional component used in the circuit of FIG. 2.

The emitters and collectors of each of the five transistors 102, 104, 106, 108 and 110 are respectively connected to ground and to separate input terminals of a general purpose TTL (transistor-transistor logic) IC (integrated circuit) 140, including six inverters (only five of which are utilized in the circuit of FIG. 2) as schematically illustrated in FIG. 4. More specifically, the collectors of the transistors 102, 104, 106, 108 and 110 are respectively connected to input or gate terminals 11, 9, 5, 3 and 1 of the IC 140. A terminal 7 of the IC 140 is connected to the ground and a terminal 14 thereof is connected to the regulated positive d.c. power supply 133. Output terminals 10, 8, 6, 4 and 2 of the IC 140 are connected to the cathodes of the light emitting diodes 112, 114, 116, 118 and 120 through resistors 122, 124, 126, 128 and 130, respectively. The anodes of these diodes are connected to the regulated, positive d.c. power supply at terminal 133.

Figure 1:
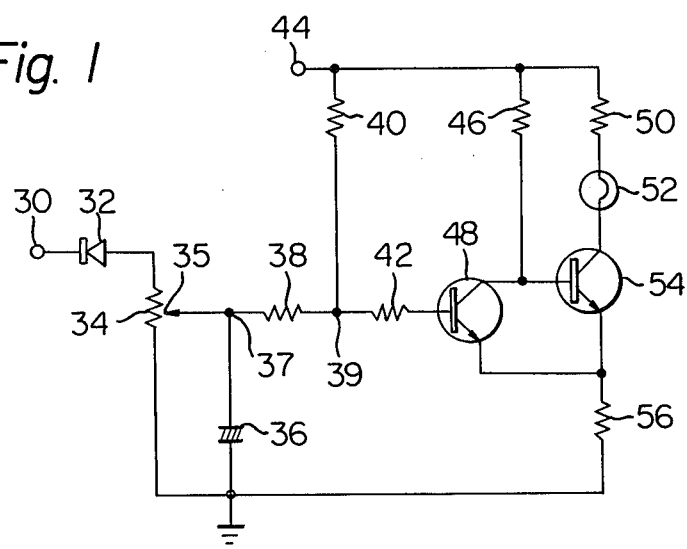
FIG. 1 is a circuit diagram of a conventional peak level indicating circuit.
Figure 3:
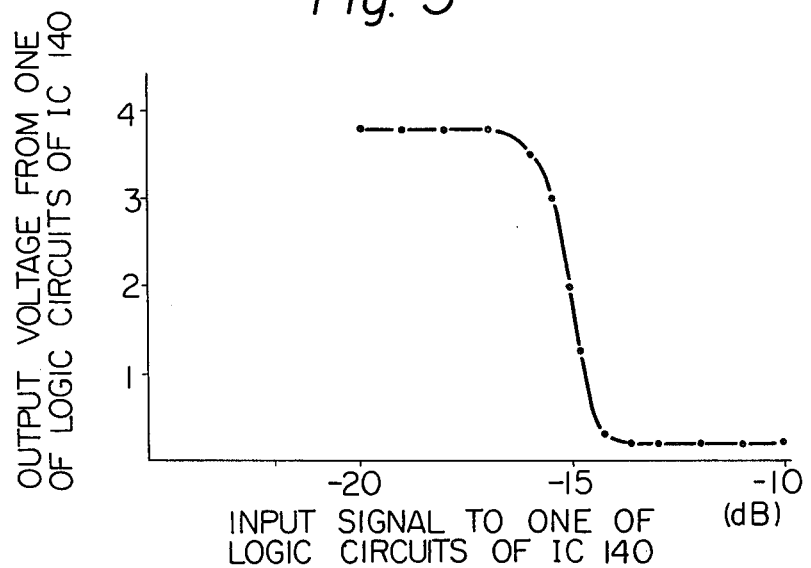
FIG. 3 is a curve of an input-output characteristic of a component used in the circuit of FIG. 2.

FIG. 3 is a curve showing variation of the output voltage of one of the logic circuits included in IC 140 as a function of the input signal to that logic circuit. When the input signal magnitude to the logic circuit is lower than a threshold value (about −16 dB), the output voltage is substantially equal to that of the positive d.c. power source at terminal 14 of IC 140, but when the input to the logic circuit is higher than the threshold value, the output voltage of that logic circuit is extremely low.

Therefore, when the added magnitude of the audio signals fed to the terminals 60 and 68 is low enough to cause the transistor 102 remain conductive due to small negative d.c. signal from the smoothing circuit, the input signal to the input terminal 11 of the IC 140 is so low that the output voltage at the terminal 10 of the IC 140 is high as seen from FIG. 3. This means that the voltage difference between the cathode and the anode of the light emitting diode 112 is very small, whereby the diode 112 is not energized. On the contrary, when the audio signal fed to the terminals 60 and 68 is high enough to cause transistor 102 to be rendered nonconductive due to the large negative d.c. signal from the smoothing circuit, the input signal to the input terminal 11 of the IC 140 is high so that the output voltage at the terminal 10 of the IC 140 abruptly falls to a low level as seen from FIG. 3. This means that the voltage difference between the cathode and the anode of the light emitting diode 112 increases to energize the same.

As is beforehand referred to, the voltage levels to render transistors 102, 104, 106, 108 and 110 into the non-conducting state determined by the values of resistors 82, 84, 86, 88 and 90 so that the transistors having higher reference numerals are cut off for larger input signals. As a result, when the added magnitude of the audio signals fed to the terminals 60 and 68 is above the magnitude for rendering only the transistor 102 nonconductive, one or more transistors in the circuit of FIG. 2 are rendered nonconductive in accordance with the magnitude of the incoming signals, thereby to energize corresponding one or more light emitting diodes. Therefore, the larger the number of the energized light emitting diodes, the higher the added peak level of the signals fed to the terminals 60 and 68.

Figure 5:
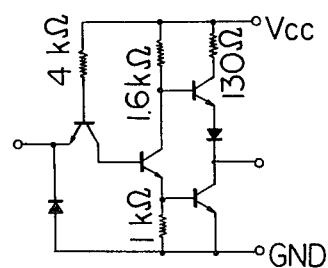

Reference is now made to FIGS. 4 and 5, which illustrate details of the TTL integrated circuit 140. In FIG. 4, six inverting logic circuits are schematically illustrated as being provided between input terminals (1, 3, 5, 9, 11 and 13) and output terminals (2, 4, 6, 8, 10 and 12), respectively. FIG. 5 is a circuit diagram of details of one inverting logic circuit included in the integrated circuit 140 of FIG. 4. Since the circuits of FIGS. 4 and 5 are well known in the art, further description thereabout will be omitted for brevity.

Figure 6:
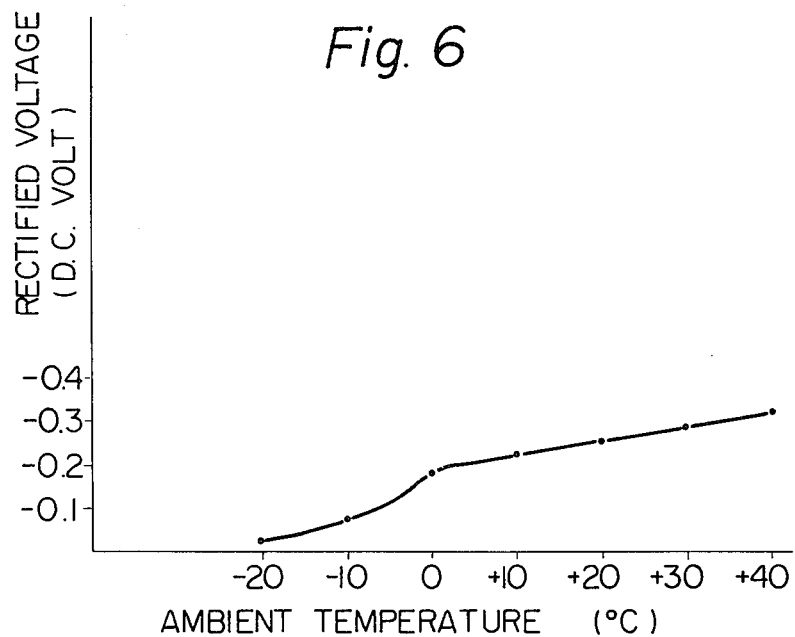
FIG. 6 is a curve of a rectified voltage variation as a function of the ambient temperature for a component used in FIG. 2.

Another feature of the present invention is compensating for changes of energization level of the light emitting diodes 112, 114, 116, 118 and 120 due to ambient temperature changes. As shown in FIG. 6, the rectified negative voltage increases to a considerable extent, as the ambient temperature rises. As a result, the increase and the decrease of the rectified negative voltage respectively decreases and increases the base current of each of the transistors 102, 104, 106, 108 and 110 of the FIG. 2. Without any compensation, these changes of the rectified voltage, undesirably alter the energization level of light emitting diodes 114, 116, 118, and 120. For example, when the ambient temperature ranges from 20° to +40° C, the change of the energization level of the light emitting diodes becomes, without any compensation, about 23 dB.

Figure 7:
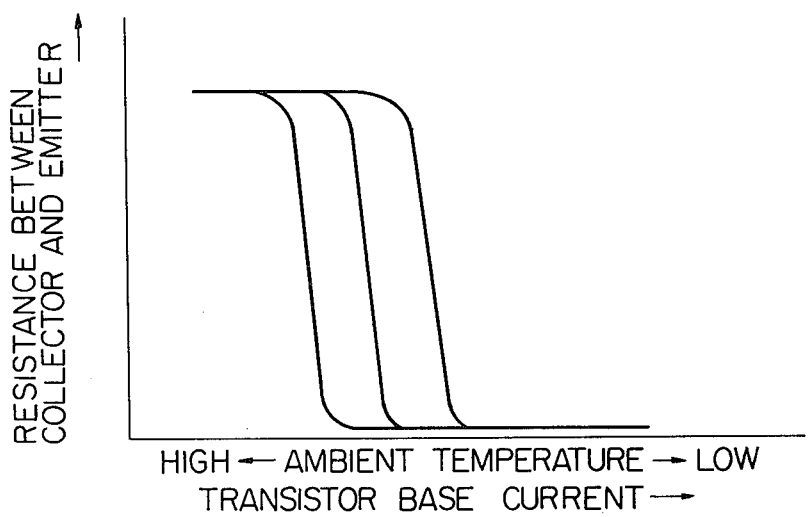
FIG. 7 is an illustration of curves of resistance variation between the collector and emitter of a transistor used in the circuit of FIG. 2, as a function of both the ambient temperature and a transistor base current.

However, as shown in FIG. 7, when the ambient temperature rises, the threshold value with respect to the resistance between the collector and the emitter of each of transistors 102, 104, 106, 108 and 110 is lowered, thus the increase of the rectified voltage can be compensated or cancelled. This applies to the case where the ambient temperature falls.

Figure 8:
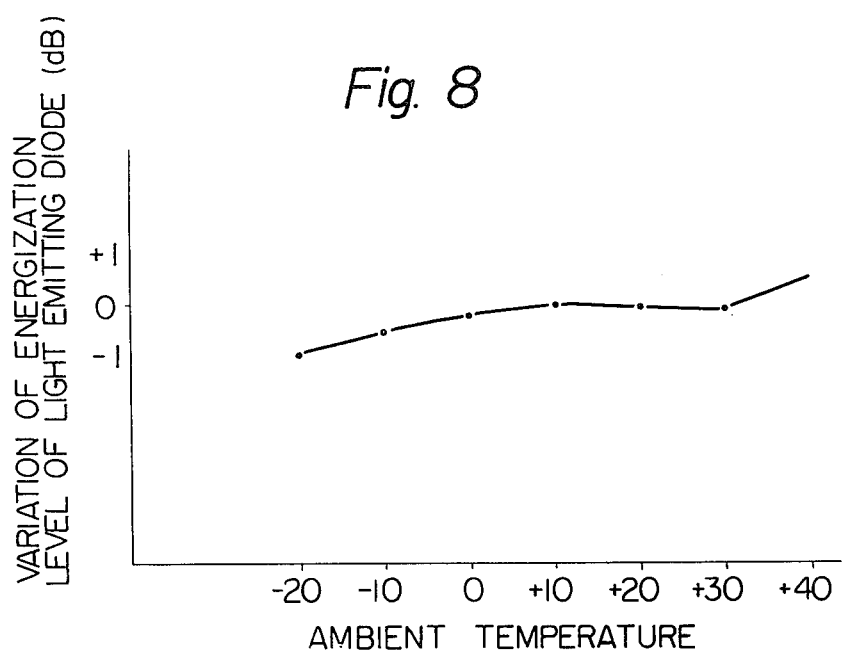
FIG. 8 is a curve of energization level change in dB as a function of the ambient temperature.

In accordance with the present invention, the change of the energization level of the light emitting diodes is within 2 dB even if the change of ambient temperature ranges from −20° to 40° C, as shown in FIG. 8.

In the foregoing, the circuit of FIG. 2 employs a general purpose TTL (transistor-transistor logic) IC, but other circuit can be used which is, for example, an HTL (high speed transistor logic) IC or a MOS (metal oxide semiconductor) IC. Furthermore, with respect to the light emitting diodes, other suitable indicators such as electric lamps can be substituted therefore. Still furthermore, NPN type of transistors of FIG. 2 can be replaced by PNP type of transistors.

It is therefore understood that, in accordance with the present invention, a peak level indicator for a.c. signal can be discretely and sequentially achieved by a simple and low cost circuit.

What is claimed is:

1. A circuit for indicating the peak level of an AC input signal, said circuit being adapted to be powered by a monopolar DC power supply having a high voltage output terminal, comprising:

rectifier means including at least one semiconductor diode, said rectifier means being responsive to the AC input signal for deriving a DC signal having a polarity opposite to that of the supply and a magnitude directly related to the amplitude of the AC input signal;

means connected between the DC power supply and the rectifier means for deriving N DC bias voltages, each of which has a different value when the DC signal magnitude has a non-zero value, where N is an integer greater than one;

N transistors, each having a base connected to be biased by a different one of the N bias voltages, each of said transistors having an emitter and a collector, one of which is connected to ground, the impedance state between the emitter and collector being either only high or low depending upon the bias voltage at the base of the particular transistor, the transistors, rectifier means and bias voltage means being connected so that all of the transistors have the same first impedance state for a zero DC signal amplitude and progressively increasing numbers of the transistors are activated into the second impedance state as the DC signal progressively increases in amplitude;

N inverting logic circuits packed in an integrated circuit, each logic circuit having a power supply terminal connected to the monopolar high voltage terminal of the supply and an input control terminal connected to the collector so as to be responsive to the impedance between the emitter and collector of the transistor to which it is connected, each of said logic circuits having an output terminal for deriving a signal reversed relative to the signal at its input terminal;

N two state visual indicators, each connected between an output terminal of a different one of the inverting logic circuits and the high voltage terminal of the monopolar power supply, so that in response to $k$ of said transistors being in the second impedance state a corresponding number of said visual indicators are activated to indicate the amplitude of the signal source, where $k = 0, 1, ..., N$.

2. The circuit of claim 1 wherein the means for deriving the bias voltages maintains all of the transistors in the low impedance state while the DC signal has a zero amplitude, the rectifier means including circuit elements causing the DC signal voltage applied to the bases of the transistors to have a tendency to increase away from zero as temperature increases, increases in ambient temperature having a tendency to cause the transistors to be switched from the low impedance state to the high impedance state at a lower DC current for the base, whereby the combined tendencies of the circuit elements and the transistors tend to maintain the switching characteristics of the transistors and energization of the indicators constant over a substantial ambient temperature range.

3. The circuit of claim 2 wherein the rectifier means includes a voltage multiplier constructed of at least two semiconductor diodes for the signal, said voltage multiplier deriving the opposite polarity DC signal.

4. The circuit of claim 1 wherein the rectifier means includes a voltage multiplier constructed of at least two semiconductor diodes for the input signal, said voltage multiplier deriving the opposity polarity DC signal.

5. The circuit of claim 4 wherein the voltage multiplier includes a smoothing circuit.

6. The circuit of claim 5 wherein the smoothing circuit includes a shunt capacitor and shunt resistor.

7. The circuit of claim 5 wherein the bias voltage deriving means comprises N pairs of first and second resistors, each pair of the first and second resistors being connected in series between the smoothing circuit and the DC power supply, the value of each first resistor being equal and the value of each second resistor being different from that of all of the other second resistors, and a junction between the first and second resistors of each pair of resistors being respectively connected to the base of a different one of the transistors.

8. The peak level indicating cirucit of claim 7, further comprising a variable resistor connected between the smoothing circuit and the bias voltage deriving means for controlling the current flowing into each of the transistors, thereby to control the energization of each of the indicators.

9. The peak level indicating circuit of claim 1 wherein each of the indicators is a light emitting diode.

10. The peak level indicating circuit of claim 1 wherein each of said indicators is a lamp.

11. The peak level indicating circuit of claim 1 further comprising a Zener diode connected between the DC power supply and ground.

12. A circuit for indicating the peak value of an AC input signal comprising:

a single, monopolar, high voltage DC power supply terminal to which the circuit is connected, rectifier means including at least one semi-conductor diode, said rectifier means being responsive to the AC input signal for deriving a DC signal having a polarity opposite to that at the terminal and a magnitude directly related to the amplitude of the AC signal, a transistor having a base, an emitter and collector, one of which is connected to ground, the impedance state between the emitter and collector being either only high or low depending upon the magnitude of a bias voltage at the base, means for connecting the high voltage terminal and the DC signal to the base so that the transistor is biased into the first impedance state for a zero DC signal amplitude and is biased into the second impedance state for a DC signal amplitude above a predetermined value, said rectifier means including circuit elements causing the DC signal voltage applied to the base of the transistor to have a tendency to increase away from zero as temperature increases, said means for connecting biasing the transistor in the low impedance state while the DC signal has a zero amplitude, increases in ambient temperature having a tendency to cause the transistor to be switched from the low impedance state to the high impedance state at a lower DC current for the base, and on-off indicator means connected to be responsive to the impedance state between the emitter and collector so that the indicator means is in first and second of its states in response to the impedance being in the first and second states, respectively, whereby the combined tendencies of the circuit elements and the transistor tend to maintain the switching characteristics of the transistor and energization of the indicator constant over a substantial ambient temperature range.

13. The circuit of claim 12 wherein the rectifier means includes a voltage multiplier constructed of at least two semiconductor diodes for the input signal, said voltage multiplier deriving the opposite polarity DC signal.

* * * * *